(12) United States Patent
Gallagher et al.

(10) Patent No.: US 8,769,445 B2
(45) Date of Patent: Jul. 1, 2014

(54) METHOD FOR DETERMINING MASK OPERATION ACTIVITIES

(75) Inventors: Emily E. Gallagher, Burlington, VT (US); Jed H. Rankin, Richmond, VT (US); Alan E. Rosenbluth, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 897 days.

(21) Appl. No.: 12/887,565

(22) Filed: Sep. 22, 2010

(65) Prior Publication Data

US 2012/0070064 A1 Mar. 22, 2012

(51) Int. Cl.
*G06F 17/50* (2006.01)

(52) U.S. Cl.
USPC ............... 716/54; 716/50; 716/51; 716/52; 716/53; 716/55; 430/5; 430/30

(58) Field of Classification Search
USPC .......... 716/50–55, 118–119, 122, 139; 430/5, 430/30
See application file for complete search history.

(56) References Cited

U.S. PATENT DOCUMENTS

| | | | |
|---|---|---|---|
| 6,703,167 B2 * | 3/2004 | LaCour ............................. | 430/5 |
| 7,055,127 B2 | 5/2006 | Pierrat et al. | |
| 7,269,817 B2 | 9/2007 | Heng et al. | |
| 7,448,012 B1 | 11/2008 | Qian | |
| 2005/0198598 A1 | 9/2005 | Adam | |
| 2007/0277145 A1 * | 11/2007 | Scaman .......................... | 716/19 |
| 2008/0141195 A1 | 6/2008 | Torres Robles et al. | |
| 2009/0077520 A1 | 3/2009 | Scheffer | |
| 2009/0077521 A1 | 3/2009 | Scheffer | |
| 2009/0217218 A1 | 8/2009 | Adam | |
| 2010/0011335 A1 | 1/2010 | Chen et al. | |
| 2010/0023916 A1 | 1/2010 | Chew et al. | |

FOREIGN PATENT DOCUMENTS

KR   100864934 B1   10/2008

* cited by examiner

*Primary Examiner* — Nghia Doan
(74) *Attorney, Agent, or Firm* — Richard M. Kotulak; Hoffman Warnick LLC (57) ABSTRACT

A method and system arrangement for controlling and determining mask operation activities. Upon obtaining chip physical layout design data and running resolution enhancement technology on the chip physical layout design to generate mask features which may include any sub-resolution assist features, a placement sensitivity metric is determined for each of the generated mask features or edge fragments. In one alternative embodiment an edge placement sensitivity metric is determined for each edge of the generated mask features or edge fragments. The determined sensitivity metrics for each feature are classified and applied to subsequent mask operational activities such as post processing, write exposure and mask repair. The types of decisions based on the sensitivity metric may include minimizing or maximizing OPC processing; e-beam exposure adjustment in mask write; and selection of which mask features to repair as well as what repair criteria to then apply, and adjusting quality requirement criteria for manufacturing assessment.

13 Claims, 5 Drawing Sheets

METHOD FOR DETERMINING MASK OPERATION ACTIVITIES

BACKGROUND

The disclosure relates generally to processing and fabrication techniques for semiconductor devices, and more particularly, to photolithographic mask operation activities including creation, post processing, fabrication, inspection, disposition and repair of photolithographic masks.

Semiconductor fabrication techniques often utilize a mask or reticle in a conventional lithographic system to project an image onto a semiconductor wafer, wherein radiation is provided through (or reflected off) the mask/reticle, and passed through a focusing optical system to form the image (e.g., an integrated circuit pattern). The semiconductor wafer is positioned to receive the radiation transmitted through (or reflected off) the mask/reticle such that the image formed on the wafer corresponds to the pattern on the mask/reticle. The radiation source may be light, such as ultraviolet light, vacuum ultraviolet (VUV) light, extreme ultraviolet light (EUV), deep ultraviolet light (DUV), mid ultraviolet light (MUV) or optical sources. In addition, the radiation may also be x-ray radiation, e-beam radiation, energized ions or particles, etc. Generally, the formed image is projected on the wafer in order to pattern a layer of material, such as a photoresist material. The photoresist material, in turn, may be utilized to define doping regions, deposition regions, etching regions, or other structures associated with the manufacture of integrated circuits (ICs).

Each time that a layer of material is exposed to radiation, a mask must be used to expose only the desired areas to the radiation, and to protect the other areas from exposure. The mask is created from circuit layout data. That is, the geometric elements described in layout design data define the relative locations or areas of the circuit device that will be exposed to radiation through the mask. A mask or reticle writing tool is used to create the mask based upon the layout design data, after which the mask can be used in a photolithographic process. The image created in the mask is often referred to as the intended or target mask image, while the image created on the substrate, by employing the mask in the photolithographic process, is referred to as the printed or wafer image.

As designers and manufacturers continue to increase the number of circuit components in a given area and/or shrink the size of circuit components, the shapes reproduced on the substrate become smaller and are placed closer together. This reduction in feature size increases the difficulty of faithfully reproducing the image intended by the layout design onto the substrate. In addition, the size of the features to be produced is getting smaller relative to the wavelength of the light, thus there is additional distortion from diffraction and other optical effects. One reason for non-perfect yields is that as feature sizes shrink, the dominant cause of defects change. In smaller process technologies, for example the nanometer process technology, a dominant source of yield loss is pattern-dependent effects. These defects can be the result of the design's features being smaller than the wavelength of light. As a result, the physical effects of light at these smaller feature sizes must be accounted for.

Various common techniques exist for mitigating these effects. For example, resolution enhancement technology (RET) manufacturability and resolution improvement techniques, such as scattering bars and sub-resolution assist features, double or multiple patterning, and phase shift masks (PSM), are commonly employed to prepare physical layout designs for manufacturing. RET lithographic compensations such as optical process correction (OPC) techniques for distortion correction are typically employed as well. Additionally, physical verification techniques that assist in accounting for issues such as planarization and antenna effects are also employed on physical layout designs. Although these extensive modifications to the physical layout design can result in a mask layout design unrecognizable by the designer, the resulting manufactured circuit matches the designer's intent. Application of these techniques requires the optical lithographic process to be simulated. This simulation is often accomplished by modeling the optical lithographic process. Generation of an optical model first requires that various designs be manufactured by the optical process to be modeled. Subsequently, measurements are taken of the manufactured design and models may be generated based upon the measurements of the actual manufactured design and the intended design. As indicated above, designs and the optical lithographic processes used to manufacture the designs are increasing in complexity. Accordingly, generation of optical models as well as application of resolution enhancement techniques in addition to optical proximity correction is increasingly burdensome in terms of post processing. There are also correspondingly increasing overheads in mask write times and repair requirements.

Photolithography masks are fabricated at a significant cost and time. One of the cost drivers in mask production is the need for producing minimum defect masks, through dispositioning and repair. Other costs are long lead times as well as the direct fabrication costs attributable to post processing, mask writing, and fabrication. For example, OPC is becoming increasingly non-constrained, resulting in an explosion of additional shapes and edge fragments. Changing OPC fragmentation rules increases shot counts, and correspondingly increases the e-beam mask write times for mask fabrication. In addition to the direct costs, the fabrication times for creating a new mask can delay product qualification, resulting in further economic loss.

SUMMARY

A first aspect of the disclosure provides a method for determining mask operation activities. The method includes providing rule based placement sensitivity classes as based on a placement sensitivity metric. Mask art data including mask features is generated and a placement sensitivity classification for each portion of each mask feature is determined. Subsequent mask operational activity decisions for each mask feature are based on the placement sensitivity classification determined for that mask feature. The mask operational activity decision may include, for example, at least one of: changing how lines are fragmented and moved; changing how a mask exposure is performed on different features; changing how a mask is dispositioned for critical dimension and image placement; changing how defects are classified; changing how defects are repaired; and changing how defects are dispositioned.

A second aspect of the disclosure provides a method for determining mask operation activities. The method includes: obtaining physical layout design data for a programmable data processing apparatus; and, using at least one computing device for: running at least one resolution enhancement technology process on the physical layout design data to generate mask features; determining an edge placement sensitivity metric for each edge of the generated mask features including the sub-resolution assist feature; and making a mask operational activity decision based on the edge placement sensitivity metric.

A third aspect of the disclosure provides a computer system for determining mask operation activities. The computer system includes: a component configured to obtain chip physical layout design data to the computer infrastructure; a component for running at least one resolution enhancement technology process on the chip physical layout design data to generate mask features; a component for determining an edge placement sensitivity metric for each edge of the generated mask features including the sub-resolution assist feature; and a component for making mask operational activity decisions based on the sensitivity metric.

A fourth aspect of the disclosure provides a computer program comprising program code embodied in at least one computer readable storage medium, which when executed, enables a computer system to implement a method for determining mask operation activities, the method comprising: obtaining rule based placement sensitivity classes as based on a placement sensitivity metric; generating mask art data, including mask features; determining which placement sensitivity classification a mask feature is in; and, making mask operational activity decisions based on the classification of the feature.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are schematical in nature and not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The disclosure provides a method and system arrangement for controlling and determining mask operation activities. Chip physical layout design data is obtained and resolution enhancement technology is run on the chip physical layout design to generate mask features. These mask features may include sub-resolution assist features. A placement sensitivity metric is determined for each of such generated mask features. In an embodiment, an edge placement sensitivity metric is determined for each edge of the generated mask features. The determined sensitivity metrics for each feature are classified and applied to subsequent mask operational activities such as post processing, write exposure and mask repair.

The present disclosure may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "module" or "system." Furthermore, aspects of the present disclosure may take the form of a computer program product embodied in any tangible medium of expression having computer readable program code embodied in the medium.

Any combination of one or more computer readable medium(s) may be utilized. The computer readable medium may be a computer readable storage medium or a computer readable signal medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of a computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this disclosure, a computer readable storage medium may be any tangible medium that can contain or store a program for use by or in conjunction with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments taught herein. It will be understood that each block of the flowchart illustrations and/ or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer or other programmable data processing apparatus to function in a particular manner, such that the instructions stored in the computer readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 1:
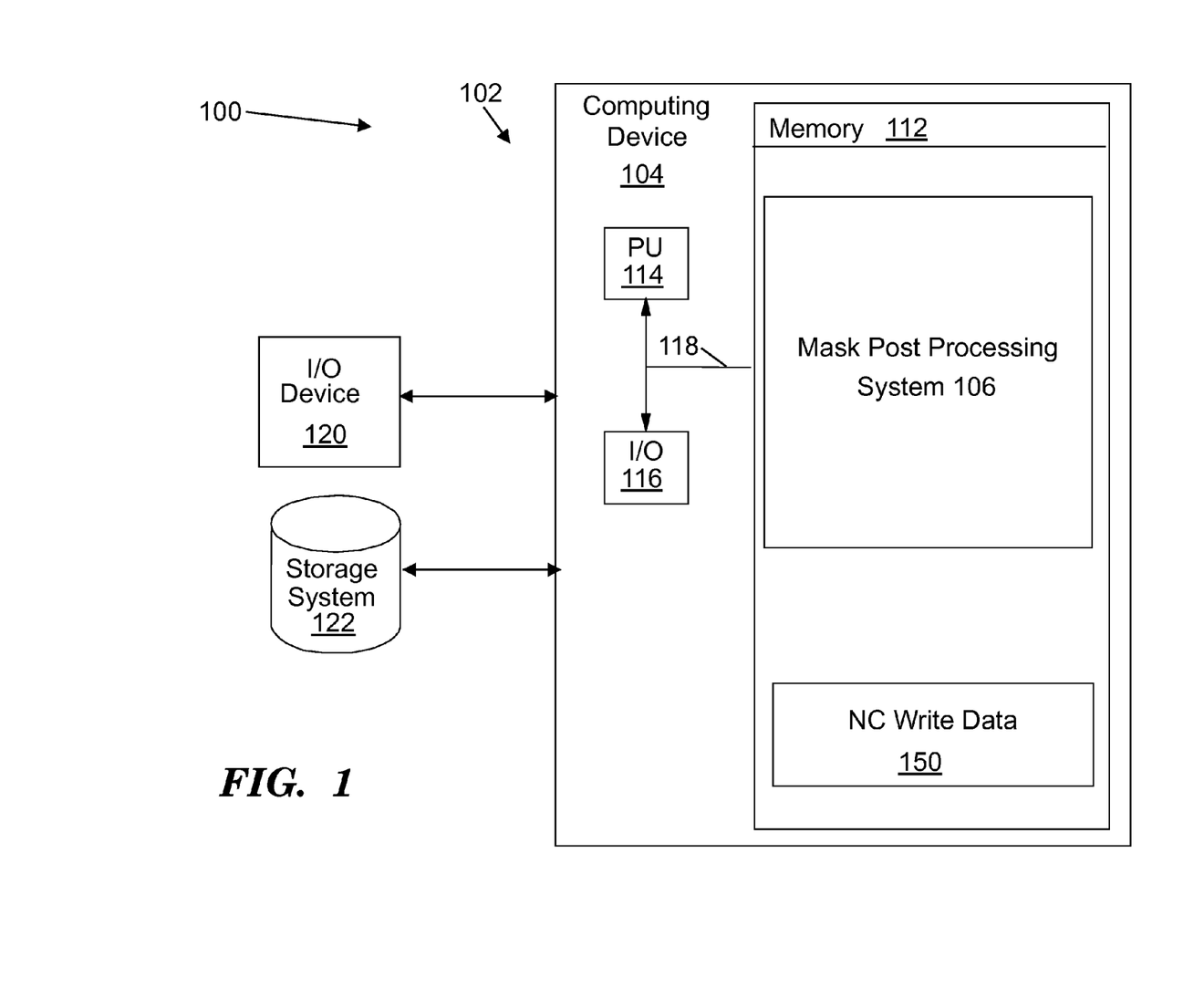
FIG. 1 shows a computational system suited for enablement of the disclosed methodology.

Referring now to FIG. 1 there is depicted an illustrative environment 100 for enabling a method for determining mask operation activities in accordance with an embodiment. Environment 100 includes a computer infrastructure 102 that can perform the various processes described herein for determining mask operation activities. In particular, computer infrastructure 102 is shown including a computing device 104 that comprises a mask art post processing system 106, which enables computing device 104 to implement a method for determining mask operation activities in accordance with an embodiment.

Computing device 104 is shown including a memory 112, a processor (PU) 114, an input/output (I/O) interface 116, and a bus 118. Further, computing device 104 is shown in communication with an external I/O device/resource 120 and a storage system 122. As is known in the art, in general, processor 114 executes computer program code, such as that for a mask art post processing system 106, that is stored in memory 112 and/or storage system 122. While executing computer program code, processor 114 can read and/or write data, such as read mask art data and write numeric control (NC) mask write data 150, to/from memory 112, storage system 122, and/or I/O interface 116. Bus 118 provides a communications link between each of the components in computing device 104. I/O device 120 can comprise any device that enables a user to interact with computing device 104 or any device that enables computing device 104 to communicate with one or more other computing devices such as a laser, e-beam or other mask write exposure tool. Input/output devices (including but not limited to keyboards, displays, pointing devices, etc.) can be coupled to the system either directly or through intervening I/O controllers.

In any event, computing device 104 can comprise any general purpose computing article of manufacture capable of executing computer program code installed by a user (e.g., a personal computer, server, handheld device, etc.). However, it is understood that computing device 104 and mask art processing system 106 are only representative of various possible equivalent computing devices that may perform the various process steps of the disclosure. To this extent, in other embodiments, computing device 104 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the disclosure. For example, in one embodiment, computer infrastructure 102 comprises two or more computing devices (e.g., a server cluster) that communicate over any type of wired and/or wireless communications link, such as a network, a shared memory, or the like, to perform the various process steps of the disclosure. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

Further, mask art post processing system 106 can be implemented using a set of modules. In this case, a module can enable computing device 104 to perform a set of tasks used by mask art post processing system 106, and can be separately developed and/or implemented apart from other portions of mask art post processing system 106. As used herein, the term "component" means any configuration of hardware, with or without software, which implements the functionality described in conjunction therewith using any solution, while the term "module" means program code that enables a computing device 104 to implement the actions described in conjunction therewith using any solution. When fixed in memory 112 of a computing device 104 that includes a processor 114, a module is a substantial portion of a component that implements the actions. Regardless, it is understood that two or more components, modules, and/or systems may share some/all of their respective hardware and/or software. Further, it is understood that some of the functionality discussed herein may not be implemented or additional functionality may be included as part of computing device 104.

When computing device 104 comprises multiple computing devices, each computing device can have only a portion of mask art post processing system 106 fixed thereon (e.g., one or more modules). However, it is understood that computing device 104 and mask art post processing system 106 are only representative of various possible equivalent computer systems that may perform a process described herein. To this extent, in other embodiments, the functionality provided by computing device 104 and mask art post processing system 106 can be at least partially implemented by one or more computing devices that include any combination of general and/or specific purpose hardware with or without program code. In each embodiment, the hardware and program code, if included, can be created using standard engineering and programming techniques, respectively.

Figure 2:
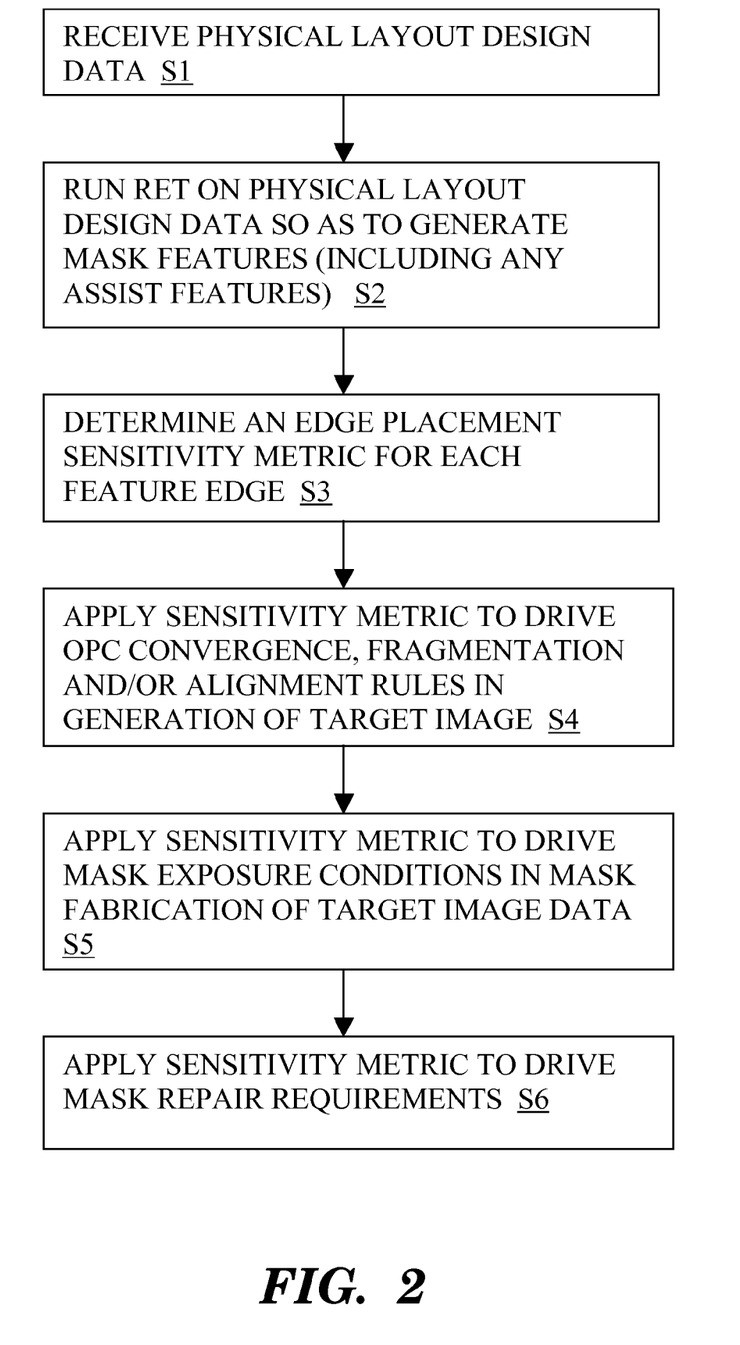
FIG. 2 depicts a process flow diagram in accordance with an embodiment.

FIG. 2 depicts a process flow diagram in accordance with an embodiment. The physical layout design data as generated by, for example, a physical design team is obtained/received into the system 102 at S1. Resolution enhancement technology is applied to the physical layout design data source to generate mask features having edges. In an embodiment, the resolution enhancement technology program that is run would be expected to be that which provides any needed assist features, also having edges, at S2. At S3, an edge placement sensitivity metric is determined for each feature edge, be they original mask features or assist features. These edge placement sensitivity metrics are then fed forward for determinations made in various subsequent mask operation activities, such activities including but not limited to: design data and mask post processing; mask exposure/mask build; and, mask repair steps, alone or in combination. In one example, the edge placement sensitivity metrics are applied to drive optical proximity correction convergence, fragmentation, and/or alignment rules in the generation of the given desired target image, as noted at S4, and which will be further discussed below. In addition, or in the alternative, the sensitivity metrics may be sent forward and applied to the mask exposure conditions in the fabrication of the target image data onto a mask as is indicated at S5. Finally at S6, the sensitivity metrics may be utilized subsequent to the mask build, in order to drive masked repair requirements.

Figure 3:
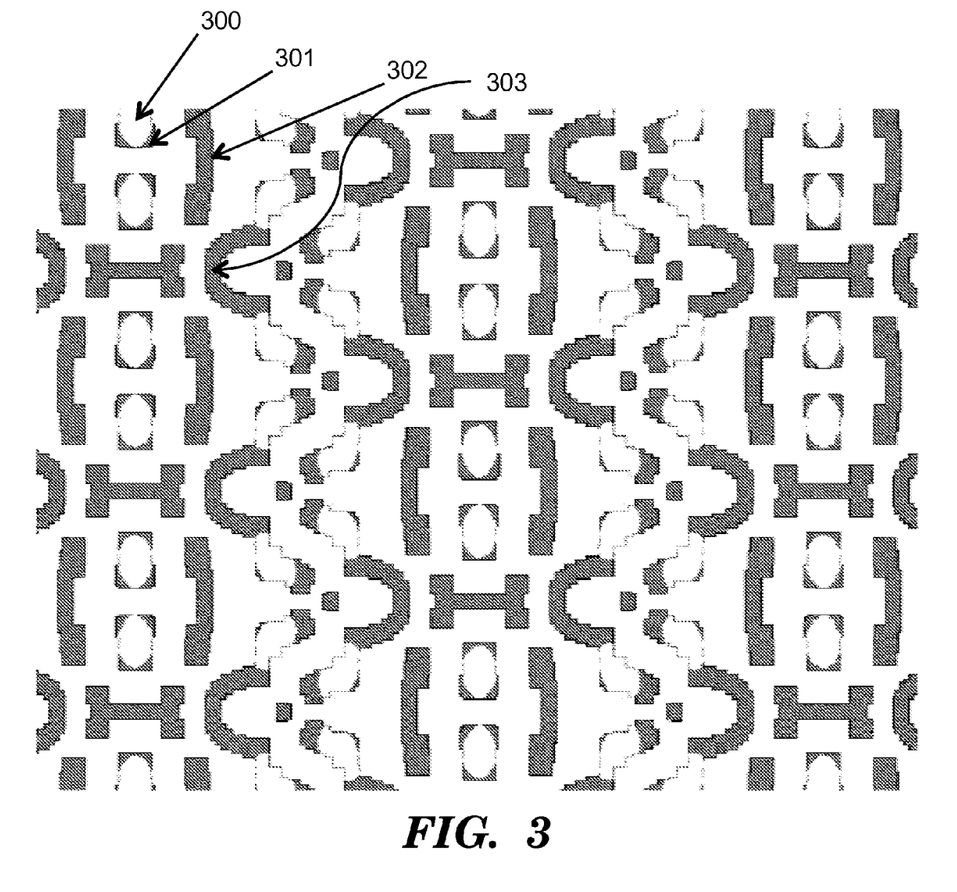
FIG. 3 depicts a mask art diagram for an array of device contacts.

There are a plethora of approaches which may be taken in order to generate meaningful edge placement sensitivity metrics for a given mask design. One straightforward approach is simply to make a designation between primary, secondary and tertiary mask feature placement sensitivity classes for the classification of mask features. One direct approach for making such classifications would be by applying a rule-based distance heuristic simply by considering the relative distances of mask features, from each other be it center-to-center, or edge-to-edge. In FIG. 3, a desired shape outcome 300 is shown after exposure and fabrication on-chip, in this depicted example for a device contact. This desired shape outcome 300 has directly associated with it a primary mask feature 301. Assist feature 302 would be considered as having a secondary class designation because of its relative close proximity to primary feature 301. Assist feature 303 would be considered tertiary in class because of its relatively greater distance from primary feature 301, as relative to secondary feature 302. "Primary features", or primary class features are those mask features which correlate directly to printed features and have been found to be highly sensitive to dimensional deviations or defects. "Secondary features" or secondary class features are those mask features which like assist feature 302, do not correlate directly to printed features. They have been found, due to their relative proximity to primary features, to have moderate sensitivity to dimensional deviations or defects. "Tertiary features" or tertiary class features are outriggers or sub-resolution assist features just like secondary features, and also are mask features which do not correlate directly to printed features. However, they typically have even more generalized effects, and their effect is spread more upon multiple different neighboring printed features or regions of the wafer than secondary features are, and thus have low sensitivity to dimensional deviations or defects.

Other approaches may be taken for a given mask design so as to generate meaningful edge placement sensitivity metrics. In an alternative embodiment, a quasi-empirical approach may be taken. In a modeling arrangement, mask design feature edges may be shifted in correlation to the effect on printed images to calculate a correlation coefficient as for example as a slope (e.g., . . . Slope≥0.9=primary, 0.5<slope<0.9=secondary, slope<0.5=tertiary). Further rules may be defined, as for example, where the edge percent deviation is less than 10% so as to then treat that as a secondary feature, and where it is greater than 10% treat that as a primary feature.

One exemplary approach would be to employ a mask error factor (MEF) as an edge placement sensitivity metric. MEF is understood by those skilled in the art as a figure of merit for a given photolithographic process. In a photolithographic process, critical dimensions (CD) of exposed features in photoresist need to be controlled to within a specified tolerance related to the nominal feature size. A portion of this tolerance budget is consumed by variations in CD on the photomask. A number of parameters in the lithography system impact linearity including lens aberrations, defocus, exposure, partial coherence, and photoresist contrast. The combined effect of these parameters is that errors in the mask CDs are not transferred to the wafer in direct proportion to the optical reduction value of the lithography system. This MEF consumes a larger than anticipated portion of the CD tolerance budget. MEF has been shown to have a wide range of values depending on feature size, shape (line or contact), proximity, pattern tone, mask bias, the existence of enhancement features as well as illumination method, exposure, focus, and photoresist contrast. In an exemplary embodiment, MEF may be calculated on a mask feature by mask feature basis and even for each mask feature edge, as an edge placement sensitivity metric. Mask features may then be categorized as based upon the individually calculated mask error factor as being primary, secondary or tertiary in class.

Figure 4:
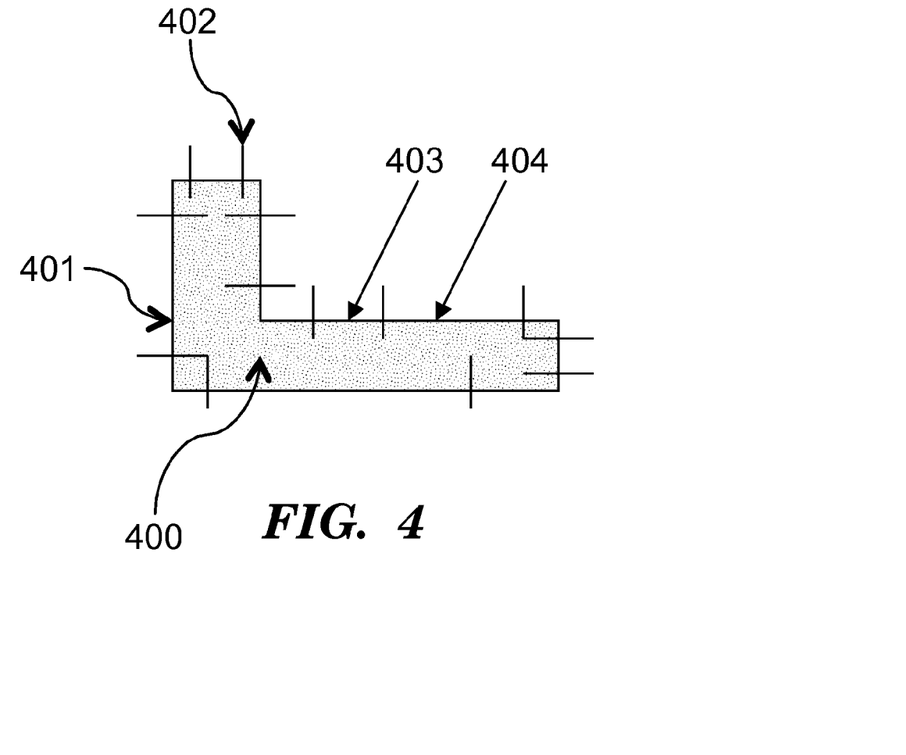
FIG. 4 shows a segmented and fragmented mask feature.

An edge by edge determination and categorization of edge placement sensitivity metrics may be applied to OPC. In FIG. 4 there is depicted mask feature 400, which is an "L" shape, and which has been segmented into two rectangles by segmentation line 401. Here, hash-marks 402 are used to delineate the fragmentation of mask feature 400 into mask feature edge segments. Two such edge segments are segment 403 and segment 404. If two such adjacent edge segments have been determined as having a low primary edge feature sensitivity, merge rules would be applied to simplify and merge segment 403 and segment 404 into a single segment. Such merging will thereby cut down on post processing time and mask exposure time, particularly when taken across an entire chip of such mask features.

Figure 5:
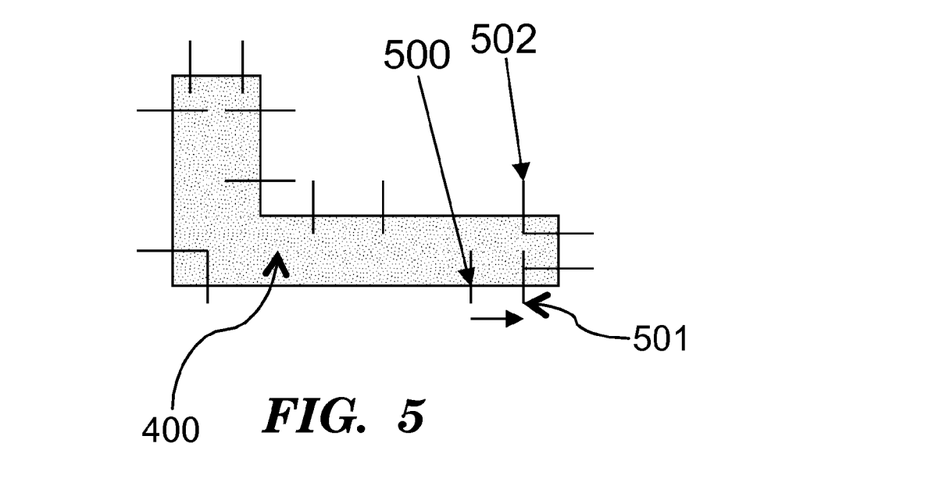
FIG. 5 depicts the mask feature of FIG. 4 with a segmentation line shift.

FIG. 5 again shows mask feature 400, but this time to delineate an alternate mask operation activity technique applied when feature 400 is determined as having the appropriate edge placement sensitivity metric. This technique is engaged by shifting hash-mark 500 (indicating a fragmentation line), to the position as indicated by the arrow pointing to location 501. This shifting of line 500 to position 501 to bring it in alignment with line 502 is beneficial for reducing the e-beam exposure time at the mask write tool and thus expedites mask build time.

Figure 6:
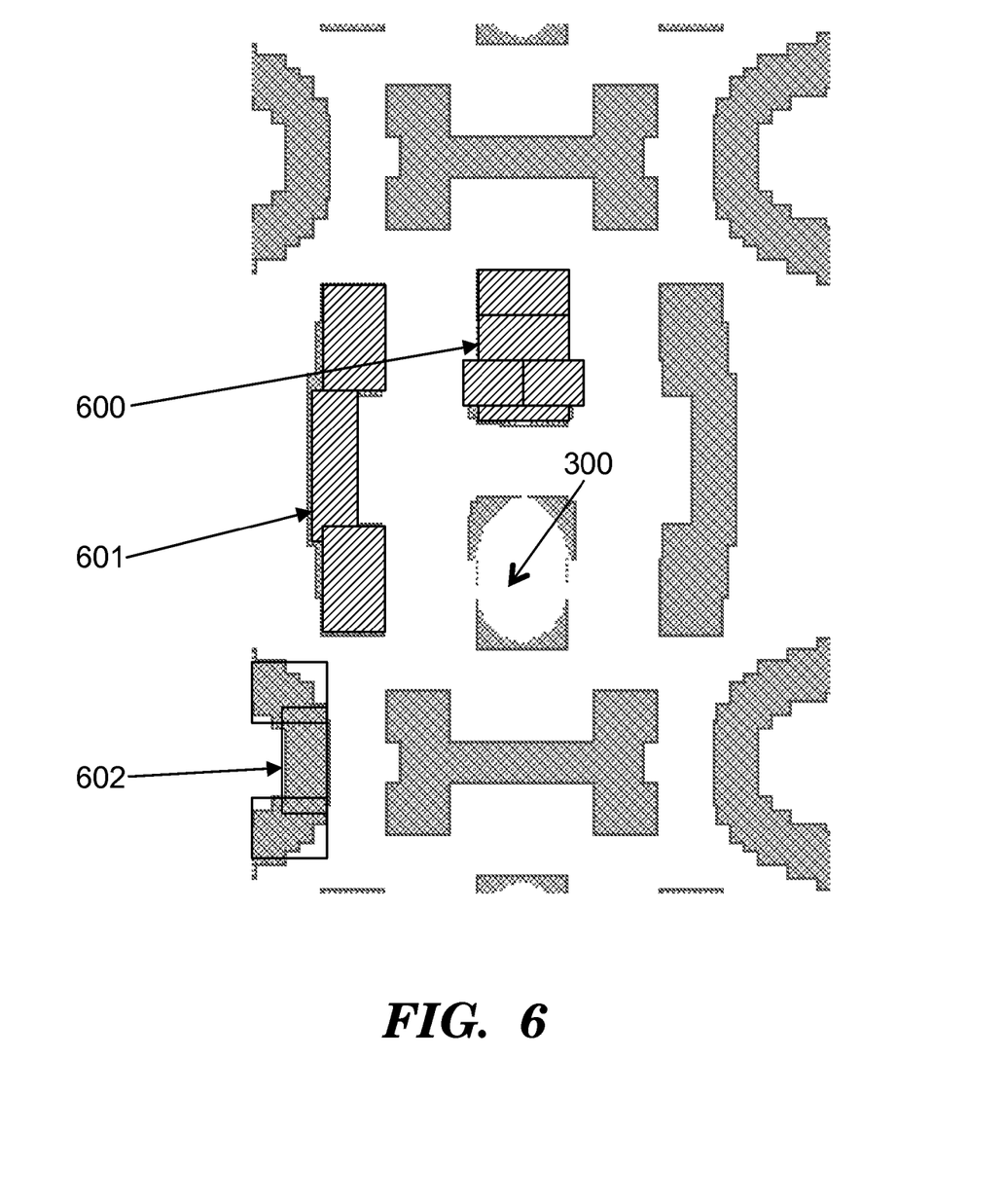
FIG. 6 shows application of various e-beam write exposure conditions to primary, secondary, and tertiary mask features.

FIG. 6 shows application of various e-beam write exposure conditions to primary, secondary and tertiary mask features. Primary designated mask art 600 has been segmented, and the e-beam exposure conditions provided for writing mask art 600 in the development of a resultant mask are deemed as appropriate for deployment utilizing a multi-pass scan with a small spot size e-beam. Similarly, secondary designated mask art 601 is also exposed with a multi-pass e-beam, but with a larger spot size. However, for tertiary designated mask art 602, only a single pass large spot size e-beam exposure is employed. This employment of a large spot size e-beam exposure that for tertiary designated mask art requires approximately only one half to one quarter as much of the feature print time as compared to the e-beam exposure time needed for primary mask art shapes. Such reductions in exposure time will thereby cut down on mask e-beam build time, particularly when multiplied across an entire chip of such mask features.

Similar gains may be realized with OPC and mask post processing by the application of primary, secondary and tertiary designations to various mask features when applied to such criteria as placement specification, centerline placement, as well as critical dimension uniformity control requirements. For example, primary features would receive tight critical dimension uniformity and tight image placement fabrication dispositioning. Secondary features may be realized with loose critical dimension uniformity and tight image placement and center line criteria fabrication dispositioning. Finally, tertiary features may be allowed to have loose critical dimension uniformity and loose image placement tolerances or criteria fabrication dispositioning. Such selective feature size control can save in disposition rejections and thereby enhance mask yield.

Similar gains can be realized with the feedback of MEF-based repair guidelines. For example, for a designated primary feature, a minimum defect tolerance, for example 3 nm defect tolerance may be applied. For a secondary designated feature, a moderate defect tolerance, such as 3 nm defect tolerance for clear features but only a 5 nm tolerance for opaque features may be applied. Finally, for tertiary designated features, a loose defect tolerance, such as 5 nm designation for clear features and a 10 nm designation for opaque features may be made. Additional classifications and dispositioning methodologies may be applied as is appropriate based on the lithography, the OPC solution, and the process characteristics.

As discussed herein, various systems and components are described as "obtaining" data (e.g., physical layout design data as generated by physical design team is obtained/received into the system 102, etc.). It is understood that the corresponding data can be obtained using any solution. For example, the corresponding system/component can generate and/or be used to generate the data, retrieve the data from one or more data stores (e.g., a database), receive the data from another system/component, and/or the like. When the data is not generated by the particular system/component, it is understood that another system/component can be implemented apart from the system/component shown, which generates the data and provides it to the system/component and/or stores the data for access by the system/component.

The foregoing flowchart and block diagram drawings in the Figures illustrate the architecture, functionality, and operation of possible implementations of systems, methods and computer program products according to various several embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method for determining a mask operation activity, comprising:
    obtaining rule based edge-placement sensitivity classes based on a placement sensitivity metric, wherein the classes comprise primary, secondary, and tertiary classes, wherein features in the primary class comprise mask features which correlate directly to printed features, features in the secondary class comprise mask features which do not correlate directly to printed features, and features in the tertiary class comprise outriggers or sub-resolution assist features which do not correlate directly to printed features; and
    using at least one computing device for:
        generating mask art data, including mask features;
        determining which placement sensitivity class of the rule based placement sensitivity classes a mask feature of the generated mask features is in; and,
        making a mask operational activity decision based on the determined placement sensitivity class of the mask feature.

2. The method of claim 1, wherein a mask operational activity for which the mask operational activity decision is made comprises one of: generating a target image; driving mask exposure conditions in mask fabrication; and determining a mask repair requirement.

3. The method of claim 1, wherein the mask operational activity comprises optical process correction.

4. The method of claim 1, wherein the placement sensitivity metric comprises a rule-based distance heuristic.

5. The method of claim 1, wherein the generating mask art data further comprises manufacturability improvement techniques for sub-resolution assist feature creation.

6. The method of claim 1, wherein the mask operational activity decision comprises at least one of:
    change how lines are fragmented and moved;

change how a mask exposure is performed on different features;

change how a mask is dispositioned for critical dimension and image placement;

change how defects are classified;

change how defects are repaired; and change how defects are dispositioned.

7. A computer program comprising program code embodied in at least one computer readable storage hardware device, which when executed, enables a computer system to implement a method for determining mask operation activities, the method comprising:

obtaining rule based placement sensitivity classes as based on a placement sensitivity metric, wherein the classes comprise primary, secondary, and tertiary classes, wherein features in the primary class comprise mask features which correlate directly to printed features, features in the secondary class comprise mask features which do not correlate directly to printed features, and features in the tertiary class comprise outriggers or sub-resolution assist features which do not correlate directly to printed features;

generating mask art data, including mask features;

determining which placement sensitivity classification of the rule based placement sensitivity classes a mask feature of the generated mask features is in; and, making mask operational activity decisions based on the determined placement sensitivity classification of the feature.

8. The computer program of claim 7, wherein the mask operational activity for which the mask operational activity decision is made comprises at least one of: generating a target image; driving mask exposure conditions in mask fabrication; dispositioning a suitability of the mask for use in wafer manufacture, and determining a mask repair requirement.

9. The computer program of claim 7, wherein the mask operational activity is optical process correction.

10. The computer program of claim 7, wherein the edge placement sensitivity metric comprises a rule-based distance heuristic applied to at least one edge of a feature.

11. The computer program of claim 10, wherein the edge placement sensitivity metric comprises a determined mask error factor applied to a single edge of a feature, the single edge selected based upon the rule-based distance heuristic.

12. The computer program of claim 7, wherein the mask operational activity includes rule-based placement sensitivity classification of the generated mask features in accordance with the determined edge placement sensitivity metric.

13. The computer program of claim 7, wherein the mask operational activity decision comprises at least one of:

changing how lines are fragmented and moved;

changing how a mask exposure is performed on different features;

changing how a mask is dispositioned for critical dimension and image placement;

changing how defects are classified;

changing how defects are repaired; and changing how defects are dispositioned.

* * * * *